(12) United States Patent
Lin et al.

(10) Patent No.: US 11,088,660 B2
(45) Date of Patent: Aug. 10, 2021

(54) POWER SUPPLY WITH ENVELOPE TRACKING MODULATION

(71) Applicant: MEDIATEK INC., Hsinchu (TW)

(72) Inventors: Shih-Mei Lin, Hsinchu (TW);
Chien-Wei Kuan, Hsinchu (TW);
Che-Hao Meng, Hsinchu (TW);
Chen-Yen Ho, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 51 days.

(21) Appl. No.: 16/728,193

(22) Filed: Dec. 27, 2019

(65) Prior Publication Data
US 2020/0244225 A1 Jul. 30, 2020

Related U.S. Application Data

(60) Provisional application No. 62/840,462, filed on Apr. 30, 2019, provisional application No. 62/796,609, filed on Jan. 25, 2019.

(51) Int. Cl.
*H03F 1/30* (2006.01)
*H03F 1/02* (2006.01)
*H03F 3/21* (2006.01)

(52) U.S. Cl.
CPC ............ *H03F 1/0238* (2013.01); *H03F 3/21* (2013.01); *H03F 2200/105* (2013.01)

(58) Field of Classification Search
CPC ........................................................ H03F 1/30
(Continued)

(56) References Cited

U.S. PATENT DOCUMENTS

| 7,058,373 B2* | 6/2006 | Grigore | ........... H03C 5/00 323/266 |
| 7,263,135 B2* | 8/2007 | Takabayashi | ........... H03F 3/24 375/296 |

(Continued)

FOREIGN PATENT DOCUMENTS

| CN | 100559319 C | 11/2009 |
| CN | 105379111 A | 3/2016 |

(Continued)

OTHER PUBLICATIONS

Paek, J.S., et al.; "An 88%-Efficiency Supply Modulator Achieving 1.08μs/V Fast Transition and 100MHz Envelope-Tracking Bandwidth for 5G New Radio RF Power Amplifier;" ISSCC 2019/ Session 15/ Power for G, Wireless Power, and GAN Converters; Feb. 2019; pp. 237-240.

(Continued)

*Primary Examiner* — Henry Choe
(74) *Attorney, Agent, or Firm* — McClure, Qualey & Rodack, LLP

(57) ABSTRACT

A power supply configured to supply a modulated voltage to a power amplifier is shown. The power supply has an alternating current (AC) component generator, a direct current (DC) component generator, and a transition accelerator. The AC component generator generates an AC component of the modulated voltage according to an envelope tracking signal. The DC component generator generates a DC component of the modulated voltage according to the operational voltage range of the power amplifier. The transition accelerator is coupled to an output terminal of the DC component generator to speed up the transition of the modulated voltage.

19 Claims, 6 Drawing Sheets

(58) Field of Classification Search
USPC .................................. 330/297, 129, 136, 296
See application file for complete search history.

(56) References Cited

U.S. PATENT DOCUMENTS

| | | | |
|---|---|---|---|
| 8,400,217 B2 * | 3/2013 | Drogi .................... | H03F 3/195 |
| | | | 330/129 |
| 8,698,558 B2 | 4/2014 | Mathe et al. | |
| 9,853,603 B2 | 12/2017 | Wang | |
| 9,912,306 B1 | 3/2018 | Lin et al. | |
| 9,923,520 B1 | 3/2018 | Abdelfattah et al. | |
| 10,171,038 B1 | 1/2019 | Chen et al. | |
| 2015/0236651 A1 | 8/2015 | Yang et al. | |
| 2015/0236652 A1 | 8/2015 | Yang et al. | |

FOREIGN PATENT DOCUMENTS

| | | |
|---|---|---|
| CN | 107112953 A | 8/2017 |
| CN | 104779922 B | 5/2018 |
| EP | 3 017 541 B1 | 8/2019 |
| TW | 201806311 A | 2/2018 |

OTHER PUBLICATIONS

European Search Report dated Jun. 18, 2020, issued in application No. EP 20152325.5.

Paek, J.S., et al.; "Design of Boosted Supply Modulator With Reverse Current Protection for Wide Battery Range in Envelope Tracking Operation;" IEEE Transactions on Microwave Theory and Techniques; vol. 67; No. 1; Jan. 2019; pp. 183-194.

Chinese language office action dated Oct. 6, 2020, issued in application No. TW 108148345.

* cited by examiner

5G NR frame structure at 4 numerology 1 frame = 10 subframes = 10ms 1 subframe = 16 slots = 1ms 1 sub-carrier spacing (SCS) = 240kHz 1 slot = 14 symbols = 62.5μs CP = 290ns    Symbol w/o CP = 4.16μs

POWER SUPPLY WITH ENVELOPE TRACKING MODULATION

CROSS REFERENCE TO RELATED APPLICATIONS

This application claims the benefit of U.S. Provisional Application No. 62/796,609 filed on Jan. 25, 2019, and U.S. Provisional Application No. 62/840,462, filed on Apr. 30, 2019, the entirety of which is incorporated by reference herein.

BACKGROUND OF THE INVENTION

Field of the Invention

The invention relates to a power supply with envelope tracking modulation, and more particularly to wide frequency-range applications.

Description of the Related Art

FIG. 1A is a block diagram illustrating supplying a supply voltage to a power amplifier (PA) 11 based on a fix drain bias approach (Vdd). In FIG. 1A, the power amplifier 11 operates based on a supply voltage Vdd which is a constant voltage. The power amplifier 11 amplifies the input signal Sin to generate an amplified output signal Sout.

FIG. 1B is a schematic diagram illustrating power Ln1 supplied to and consumed by the power amplifier 11 based on the fixed drain bias approach (Vdd). The horizontal line Ln1 represents that the supply voltage Vdd supplied to the power amplifier 11 is constant, In FIG. 1B, the area shown with oblique lines (Ppa) represents actual power consumption of the power amplifier 11, and the area shown with dotted screentone (Pa1) represents the power which is provided to but not utilized by the power amplifier 11, Therefore, the area shown with dotted screentone (Pa1) implies unnecessary power loss in the power amplifier 11.

As shown in FIG. 1B, the fixed drain bias approach employs a fixed supply voltage Vdd to the power amplifier 11, but the power consumed by the power amplifier 11 varies all the time. As a consequence, the fixed drain bias approach results in considerable power loss and incurs thermal issues.

The supply voltage Vdd is provided by a voltage source, typically a battery. As the fixed drain bias approach is not power efficient, the battery's lifetime becomes shorter. Therefore, an efficient approach to reduce unnecessary power dissipation is desired.

To improve the operating lifetime of the battery, an envelope tracking (hereinafter, ET) power management approach is proposed. Instead of providing a fixed supply voltage Vdd to a power amplifier, a modulated voltage Vpa (that is dynamically adjusted) is supplied to the power amplifier. As the modulated voltage Vpa is varied by the instantaneous signal envelope of the power amplifier, the power loss can be significantly reduced.

However, in wide frequency-range applications, it is difficult to track the instantaneous signal envelope of the power amplifier when operating in the high frequency band.

FIG. 2 depicts a 5G new rate frame structure (at 4 numerology) as an example. One frame is 10 ms and includes 10 subframes. One subframe is 1 ms and includes 16 slots. One slot is 62.5 μs and includes 14 symbols. One symbol without cyclic prefix (CP) is 4.16 μs and one cyclic prefix (CP) is 290 ns, which are very short and result in difficulties for the power supply to track the instantaneous signal envelope.

BRIEF SUMMARY OF THE INVENTION

A power supply configured to supply a modulated voltage to a power amplifier in accordance with an exemplary embodiment of the present disclosure is shown. The power supply has an alternating current (AC) component generator, a direct current (DC) component generator and a transition accelerator. The AC component generator generates an AC component of the modulated voltage according to an envelope tracking signal. The DC component generator generates a DC component of the modulated voltage according to the operational voltage range of the power amplifier. The transition accelerator is coupled to an output terminal of the DC component generator to speed up the transition of the modulated voltage.

The transition accelerator may comprise a pull-up circuit and/or a pull-down circuit. The pull-up circuit is configured to accelerate the rise in the DC component. The pull-down circuit is configured to accelerate the drop in the DC component. The pull-up circuit may be turned on during low-to-high transition intervals of the DC component. The pull-down circuit may be turned on during high-to-low transition intervals of the direct current component.

The DC component generator may have a step-up converter and a first step-down converter. The step-up converter converts a first supply voltage to a second supply voltage that is higher than the first supply voltage. Based on the operational voltage range of the power amplifier, the first step-down converter selectively converts the first supply voltage or the second supply voltage to generate the direct current component. The transition accelerator may be powered by the first supply voltage or the second supply voltage.

The alternating current component generator may have a second step-down converter and a linear amplifier. The second step-down converter converts the first supply voltage to a third supply voltage that is lower than the first supply voltage. The linear amplifier is powered by the third supply voltage to generate the alternating current component of the modulated voltage based on the envelope tracking signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 3:
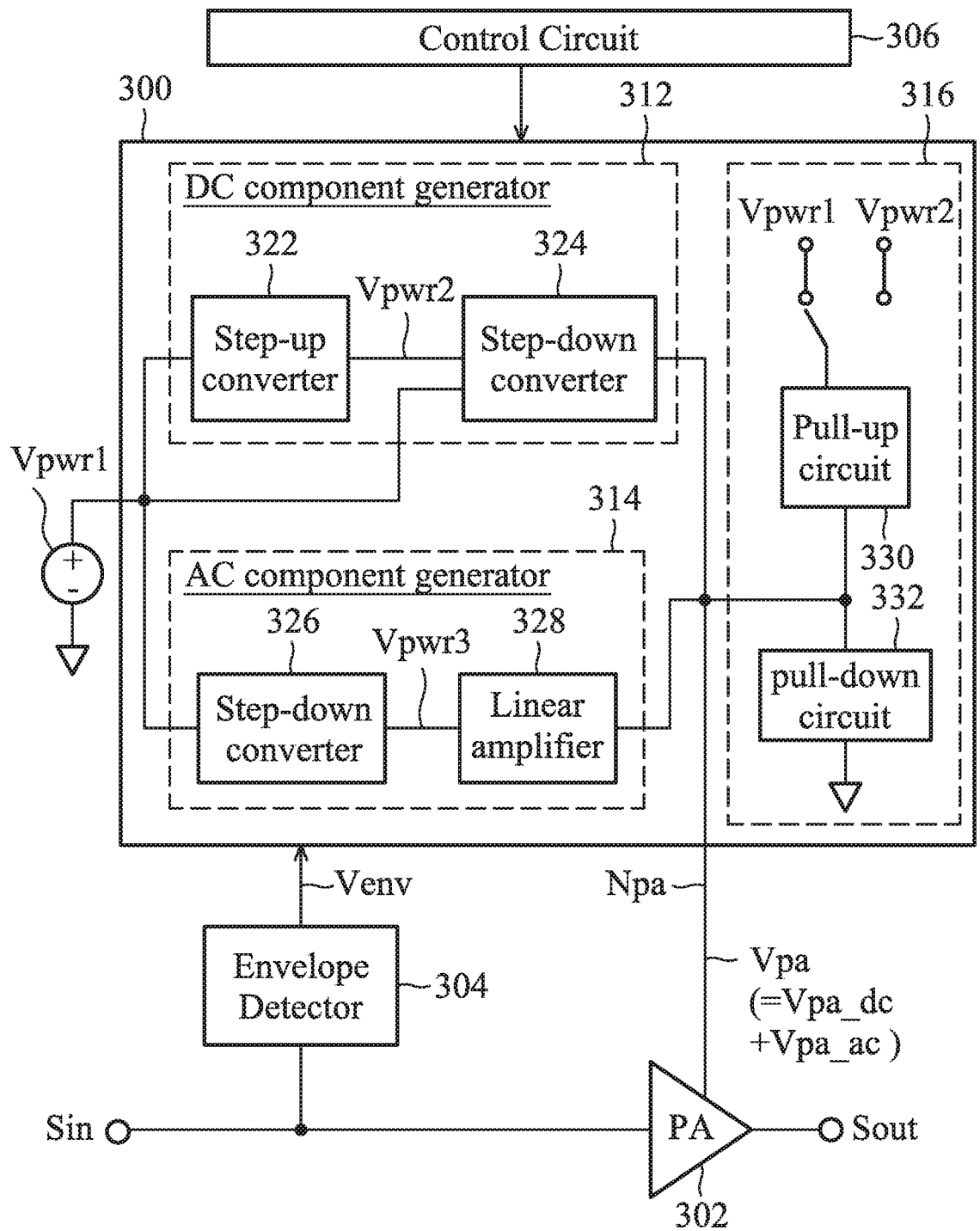
FIG. 3 is a block diagram illustrating a power supply that comprises a modulated power supply circuit 300 capable of supplying a modulated voltage Vpa to a power amplifier 302 in accordance with an exemplary embodiment of the present disclosure.

FIG. 3 is a block diagram illustrating a power supply that comprises a modulated power supply circuit 300 capable of supplying a modulated voltage Vpa to a power amplifier 302 in accordance with an exemplary embodiment of the present disclosure. The power supply further comprises an envelope detector 304 and a control circuit 306. The modulated power supply circuit 300 is powered by a supply voltage Vpwr1 (e.g., a battery), and is controlled by the envelope detector 304 and the control circuit 306.

The power amplifier 302 powered by the modulated voltage Vpa may be, for example, a class AB amplifier. After receiving an input signal Sin, the power amplifier 302 amplifies the input signal Sin to generate an amplified output signal Sout. The envelope detector 304 is configured to detect an envelope tracking signal Venv from the input signal Sin. The envelope tracking signal Venv represents and/or carries envelope information that is related to amplitude change of the input signal Sin. In some exemplary embodiments, the envelope tracking signal Venv may be transferred to the modulated power supply circuit 300 in packets.

The control circuit 306 concerns the usage environment of the entire system, selects suitable settings related to the power amplifier 302 and determines how operations of the modulated power supply circuit 300 should be adjusted. The control circuit 306 may control the modulated power supply circuit 300 according to the operational voltage range of the power amplifier 302, for a proper direct current (DC) control of the modulated voltage Vpa.

Based on the envelope tracking signal Venv and control signals from the control circuit 306, the modulated power supply circuit 300 tracks the instantaneous power needs of the power amplifier 302. Specifically, the modulated power supply circuit 300 works well in wide frequency-range applications, such as 3G, 4G or even 5G applications. The details of the modulated power supply circuit 300 are discussed in the following paragraphs.

The modulated power supply circuit 300 has a DC (direct current) component generator 312, an AC (alternating current) component generator 314, and a transition accelerator 316.

The modulated voltage Vpa provided by the modulated power supply circuit 300 includes a DC component (Vpa_dc) and an AC component (Vpa_ac). The DC component generator 312 is configured to generate the DC component Vpa_dc of the modulated voltage Vpa. The AC component generator 314 is configured to generate the AC component Vpa_ac of the modulated voltage Vpa. The outputs of the DC component generator 312 and the output of the AC component generator 314 are combined together by coupling the output terminal of the DC component generator 312 to the output terminal of the AC component generator 314, and thereby the output node Npa of the power supply outputs the modulated voltage Vpa. Specifically, the transition accelerator 316 is electrically connected to the output terminal pf the DC component generator 312 to speed the transition of the modulated voltage Vpa.

As shown, the DC component generator 312 may include a step-up converter 322 and a step-down converter 324. By the step-up converter 322 (e.g. a boost converter), the supply voltage Vpwr1 (e.g., a battery voltage) is boosted to a higher-level supply voltage Vpwr2. As controlled by the control circuit 306, the step-down converter 324 selectively converts the supply voltage Vpwr1 or the supply voltage Vpwr2 to generate the direct current component Vpa_dc based on the operational voltage range of the power amplifier 302. In an exemplary embodiment, the step-down converter 324 converts the supply voltage Vpwr1 to generate the direct current component Vpa_dc when the operational voltage range of the power amplifier 302 is lower than a threshold. When the operational voltage range of the power amplifier 302 is not lower than the threshold, the step-down converter 324 converts the supply voltage Vpwr2 to generate the direct current component Vpa_dc. Thus, a wide range DC component Vpa_dc is available.

As for the AC component path, the AC component generator 314 may include a step-down converter 326 and a linear amplifier 328. By the step-down converter 326 (e.g., a buck converter), the supply voltage Vpwr1 is converted to a lower-level supply voltage Vpwr3. The linear amplifier 328 providing the AC component Vpa_ac of the modulated voltage Vpa based on the envelope tracking signal Venv is powered by the lower-level supply voltage Vpwr3, which is more power efficient.

As shown, the transition accelerator 316 may include a pull-up circuit 330 and a pull-down circuit 332. As controlled by the control circuit 306, the pull-up circuit 330 may be coupled to the supply voltage Vpwr1 or the higher-level supply voltage Vpwr2 to instantaneously pull up the modulated voltage Vpa, or, the pull-down circuit 332 may be activated to instantaneously pull down the modulated voltage Vpa. The pull-up circuit 330 may be a current source and the pull-down circuit 332 may be a current sink. In another exemplary embodiment, the pull-up circuit 330 and the pull-down circuit 332 may be transition gates. Because of the transition accelerator 316, the transition speed of the DC component Vpa_dc is not limited by the slow transition of the passive devices of the DC component generator 312.

The pull-up circuit 330 may be turned on during low-to-high transition intervals of the DC component Vpa_dc. The pull-down circuit 332 may be turned on during high-to-low transition intervals of the direct current component DC component Vpa_dc.

In some exemplary embodiments, only the supply voltage Vpwr1 or only the higher-level supply voltage Vpwr2 is provided to power the transition accelerator 316. In some exemplary embodiments, the transition accelerator 316 contains the pull-up circuit 330 without the pull-down circuit 332, or it contains the pull-up circuit 330 without the pull-down circuit 332.

In some exemplary embodiments, the DC component generator 312 and the AC component generator 314 may have other variants. The transition accelerator 316 works for all variants of the DC and AC component generators 312 and 314.

Figure 1A:
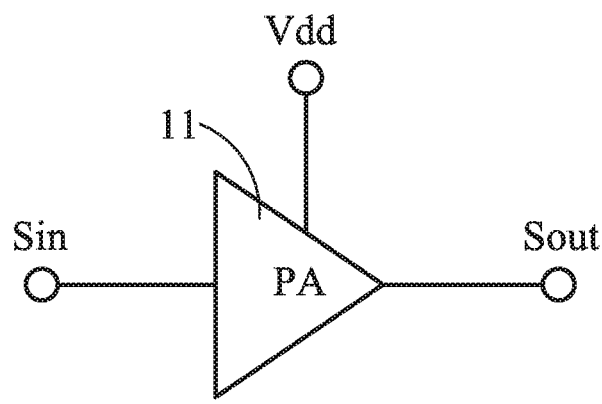
FIG. 1A is a block diagram illustrating supplying a supply voltage to a power amplifier (PA) 11 based on a fix drain bias approach (Vdd)
Figure 1B:
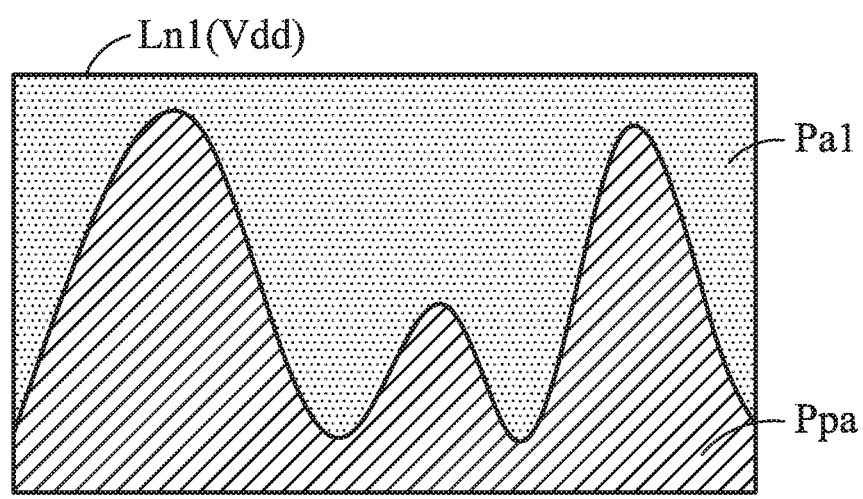
FIG. 1B is a schematic diagram illustrating power Ln1 supplied to and consumed by the power amplifier 11 based on the fixed drain bias approach (Vdd)
Figure 2:
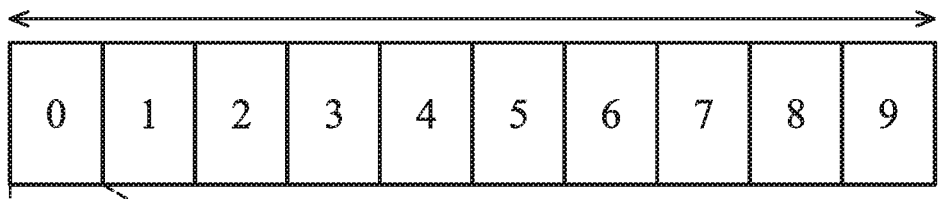
FIG. 2 depicts a 5G new rate frame structure (at 4 numerology)
Figure 2:
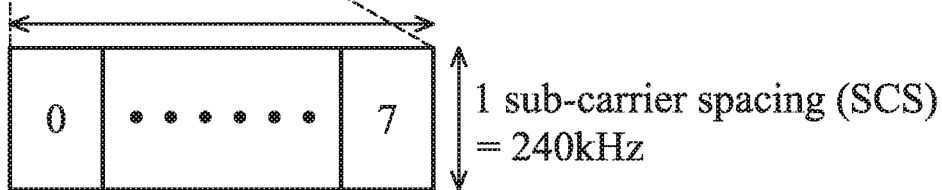
Figure 2:
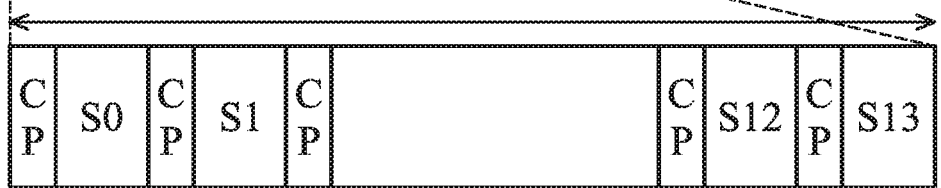

In the 5G new range (NR) example, there is no problem for the pull-up circuit 330 and a pull-down circuit 332 to pull up or pull down the DC component Vpa_dc of the modulated voltage Vpa during the narrow transition interval, 290 ns (CP in FIG. 2). The modulated voltage Vpa output by the power supply to power the power amplifier 302 is correct.

Figure 4:
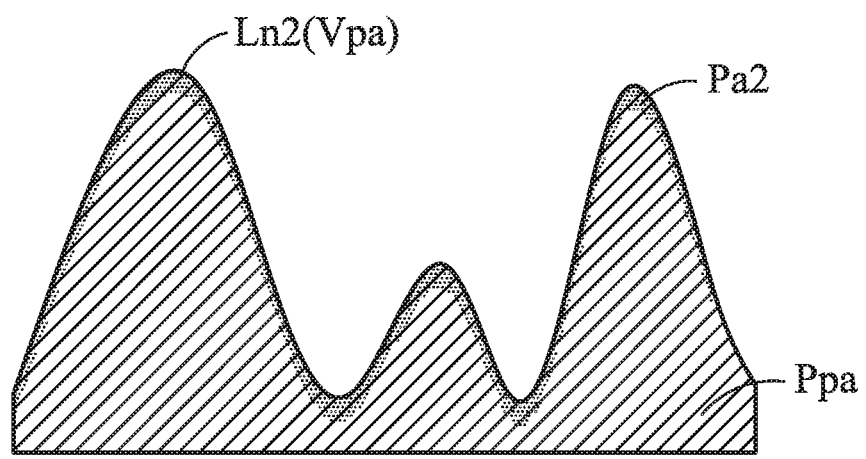
FIG. 4 is a schematic diagram illustrating power supplied to and consumed by the power amplifier 302 based on the envelope tracking bias approach (Vpa) according to an exemplary embodiment of the present disclosure.

FIG. 4 is a schematic diagram illustrating power supplied to and consumed by the power amplifier 302 based on the envelope tracking bias approach (Vpa) according to an exemplary embodiment of the present disclosure. The curve Ln2 represents the power of the modulated voltage Vpa supplied to the power amplifier 302. The area shown with oblique lines (Ppa) represents actual power consumption of the power amplifier 302. The area shown with dotted screentone (Pa2) represents unnecessary power loss in the power amplifier 302.

As the modulated voltage Vpa being generated at an output node Npa of the power supply is similar to the instantaneous input signal Sin of the power amplifier 302, in that the area with dotted screentone (Pa2) shown in FIG. 4 is very small. Therefore, the power utilization of the power supply is very efficient, and the amount of energy wasted can be reduced.

Figure 5:
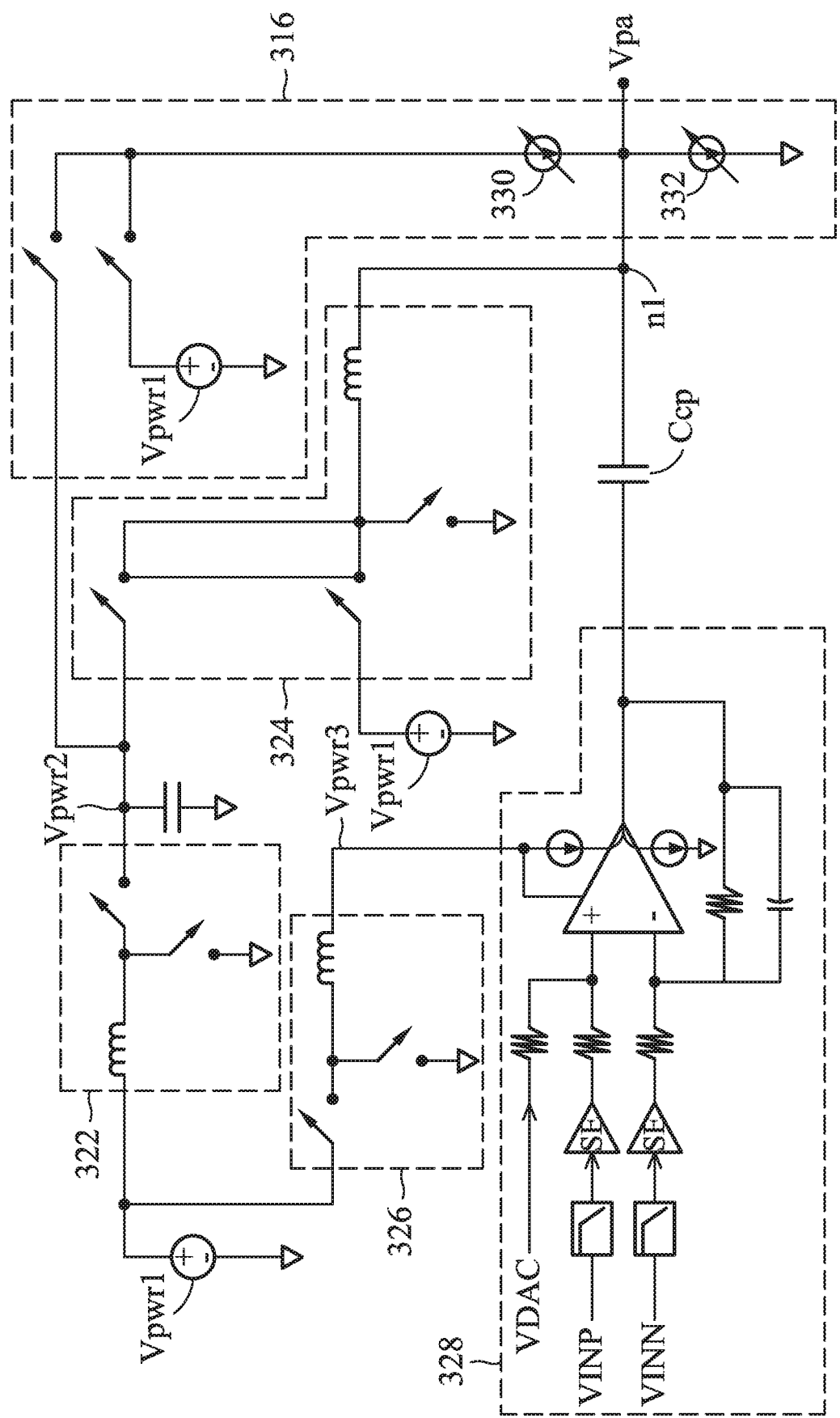
FIG. 5 is a schematic diagram illustrating circuit details of the internal blocks of the modulated power supply circuit 300 in accordance with an exemplary embodiment of the present disclosure.

FIG. 5 is a schematic diagram illustrating circuit details of the internal blocks of the modulated power supply circuit 300 in accordance with an exemplary embodiment of the present disclosure. The pull-up circuit 330 coupled to a terminal n1 (an output terminal of the DC component generator 312 formed by the converters 322 and 324) is a current source powered by the supply voltage Vpwr1 or powered by the higher-level supply voltage Vpwr2. The pull-down circuit 332 is a current sink and is coupled between the terminal n1 and a ground. The step-up converter 322 and the step-down converters 324 and 326 are formed of inductors and switches, and the switches may be controlled by the control circuit 306 according to the operational voltage range of the power amplifier 302. For example, the duty cycles of the switches may be controlled by the control circuit 306. The linear amplifier 328 operating based on a reference voltage VDAC receives the envelope tracking signal Venv in a differential way (VINP and VINN).

In this example, an AC-coupling scheme is used. There is a coupling capacitor Ccp connected between the output terminal of the linear amplifier 328 and the terminal n1. The swing of the output of the linear amplifier 328, therefore, is suppressed due to the capacitor voltage difference existing between the two terminals of the coupling capacitor Ccp, Accordingly, the output power of the linear amplifier 328 is reduced, so as the total power consumption of the modulated power supply circuit 300.

Figure 6:
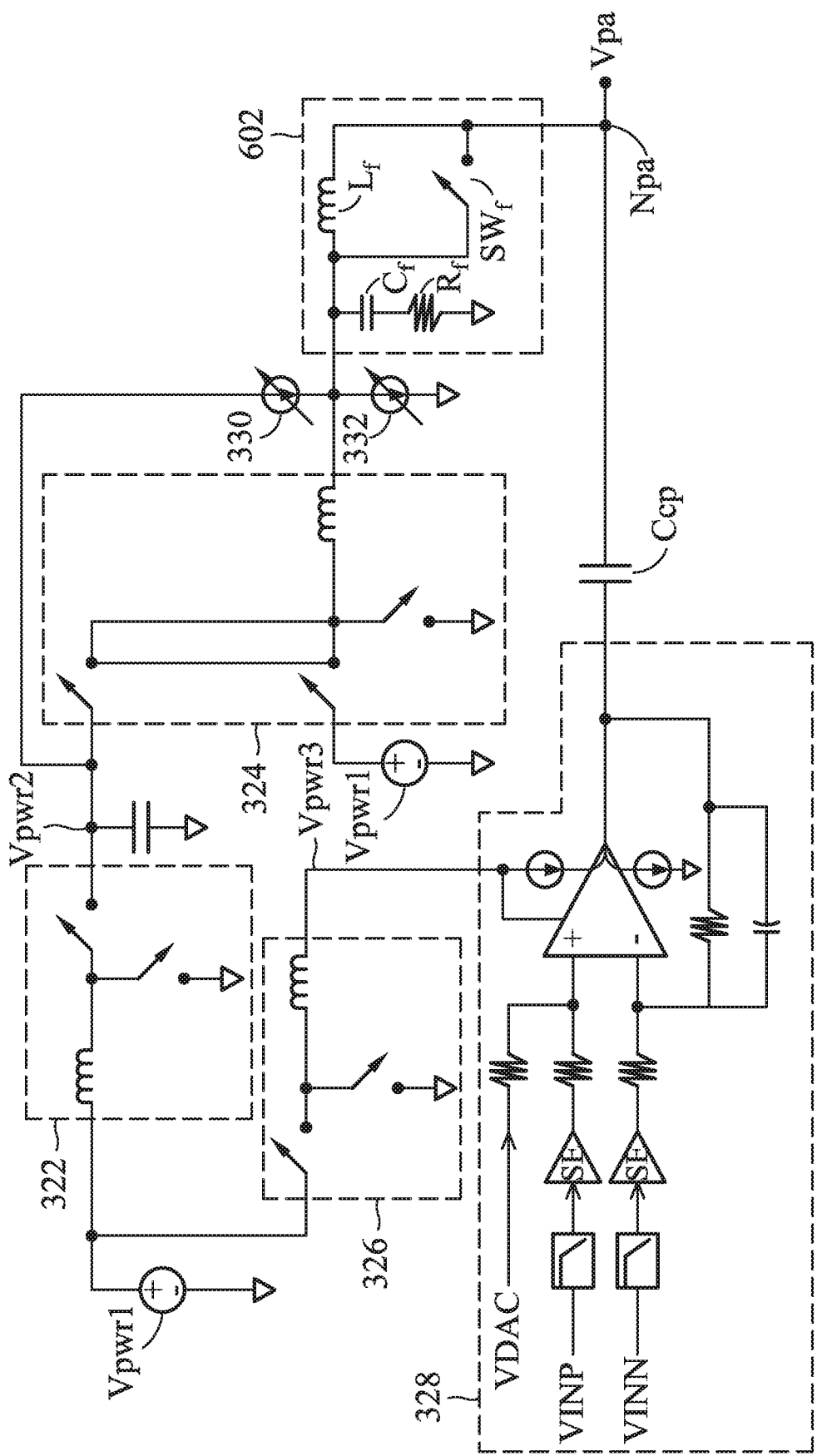
FIG. 6 is a schematic diagram illustrating circuit details of the internal blocks of the modulated power supply circuit 300 in accordance with another exemplary embodiment of the present disclosure.

FIG. 6 is a schematic diagram illustrating circuit details of the internal blocks of the modulated power supply circuit 300 in accordance with another exemplary embodiment of the present disclosure. A filter 602 is coupled between the terminal n1 and the output node Npa of the power supply. The filter 602 may be a second order filter. The filter 602 has an inductor Lf and a switch SWf connected in parallel between the terminal n1 and the output node Npa, and has a capacitor Cf and a resistor Rf connected in series between the terminal n1 and the ground. The filter 602 effectively reduces the noise injected to the power amplifier 302.

As illustrated above, power efficiency and thermal reduction of the power supply are optimized by the modulated power supply circuit 300. A power supply with the modulated power supply circuit 300 can be used in many portal applications where efficiency and battery life are paramount.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power supply, configured to supply a modulated voltage to a power amplifier, comprising:
    an alternating current component generator, configured to generate an alternating current component of the modulated voltage according to an envelope tracking signal;
    a direct current component generator, configured to generate a direct current component of the modulated voltage according to an operational voltage range of the power amplifier; and
    a transition accelerator, coupled to an output terminal of the direct current component generator to speed up transition of the modulated voltage.
2. The power supply as claimed in claim 1, wherein:
    the transition accelerator comprises a pull-up circuit, by which a rise in the direct current component is accelerated.
3. The power supply as claimed in claim 2, wherein:
    the pull-up circuit is turned on during low-to-high transition intervals of the direct current component.
4. The power supply as claimed in claim 1, wherein:
    the transition accelerator comprises a pull-down circuit, by which a drop in the direct current component is accelerated.
5. The power supply as claimed in claim 3, wherein:
    the pull-down circuit is turned on during high-to-low transition intervals of the direct current component.
6. The power supply as claimed in claim 1, wherein:
    the transition accelerator comprises a pull-up circuit, by which the rise in the direct current component is accelerated; and
    the transition accelerator further comprises a pull-down circuit, by which the drop in the direct current component is accelerated.
7. The power supply as claimed in claim 6, wherein:
    the pull-up circuit is turned on during low-to-high transition intervals of the direct current component; and
    the pull-down circuit is turned on during high-to-low transition intervals of the direct current component.
8. The power supply as claimed in claim 7, wherein:
    the pull-up circuit is a current source; and
    the pull-down circuit is a current sink.
9. The power supply as claimed in claim 7, wherein:
    the pull-up circuit and the pull-down circuit are transition gates.
10. The power supply as claimed in claim 7, further comprising:
    a coupling capacitor, coupled between an output terminal of the accelerate current component generator and an output node of the power supply.
11. The power supply as claimed in claim 7, further comprising:
    a filter, coupled between the output terminal of the direct current component generator and an output node of the power supply.

12. The power supply as claimed in claim 11, wherein the filter comprises:
   an inductor, coupled between the output terminal of the direct current component generator and the output node of the power supply;
   a switch, coupled between the output terminal of the direct current component generator and the output node of the power supply; and
   a capacitor and a resistor, connected in series between the output terminal of the direct current component generator and a ground.

13. The power supply as claimed in claim 7, wherein the direct current component generator comprises:
   a step-up converter, converting a first supply voltage to a second supply voltage that is higher than the first supply voltage; and
   a first step-down converter, receiving the first supply voltage and the second supply voltage,
   wherein:
   based on the operational voltage range of the power amplifier, the first step-down converter selectively converts the first supply voltage or the second supply voltage to generate the direct current component.

14. The power supply as claimed in claim 13, wherein:
   the first step-down converter converts the first supply voltage to generate the direct current component when the operational voltage range of the power amplifier is lower than a threshold; and
   the first step-down converter converts the second supply voltage to generate the direct current component when the operational voltage range of the power amplifier is not lower than the threshold.

15. The power supply as claimed in claim 13, wherein:
   the transition accelerator is powered by the second supply voltage.

16. The power supply as claimed in claim 13, wherein:
   the transition accelerator is powered by the first supply voltage.

17. The power supply as claimed in claim 14, wherein:
   the transition accelerator is powered by the first supply voltage when the operational voltage range of the power amplifier is lower than a threshold; and
   the transition accelerator is powered by the second supply voltage when the operational voltage range of the power amplifier is not lower than the threshold.

18. The power supply as claimed in claim 13, wherein the alternating current component generator comprises:
   a second step-down converter, converting the first supply voltage to a third supply voltage that is lower than the first supply voltage; and
   a linear amplifier, powered by the third supply voltage to generate the alternating current component of the modulated voltage based on the envelope tracking signal.

19. The power supply as claimed in claim 18, further comprising:
   a control circuit, controlling the step-up converter, the first step-down converter, the second step-down converter, and the transition accelerator according to the operational voltage range of the power amplifier; and
   an envelope detector, coupled to an input signal of the power amplifier to generate the envelope tracking signal.

* * * * *